(12) United States Patent
Harada

(10) Patent No.: US 8,482,016 B2
(45) Date of Patent: Jul. 9, 2013

(54) SEMICONDUCTOR LIGHT-EMITTING DEVICE AND MANUFACTURING METHOD

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/396,591

(22) Filed: Feb. 14, 2012

(65) Prior Publication Data

US 2012/0211774 A1 Aug. 23, 2012

(30) Foreign Application Priority Data

Feb. 14, 2011 (JP) .................................. 2011-028841

(51) Int. Cl.
*H01L 33/08* (2010.01)

(52) U.S. Cl.
USPC ........................................................ 257/88

(58) Field of Classification Search
USPC .......................... 257/88, 98, E33.072; 438/29
See application file for complete search history.

(56) References Cited

U.S. PATENT DOCUMENTS

| 7,330,319 | B2 * | 2/2008 | Ouderkirk et al. ............ 359/811 |
| 7,525,126 | B2 * | 4/2009 | Leatherdale et al. ........... 257/98 |
| 8,173,469 | B2 * | 5/2012 | Park et al. ....................... 438/47 |
| 2004/0079942 | A1 | 4/2004 | Steranka et al. |
| 2007/0023769 | A1 * | 2/2007 | Nishimoto et al. ............. 257/88 |
| 2009/0256169 | A1 * | 10/2009 | Yokoyama et al. ............. 257/98 |
| 2012/0280269 | A1 * | 11/2012 | Jeong .............................. 257/98 |
| 2013/0020603 | A1 * | 1/2013 | Jeong .............................. 257/98 |

FOREIGN PATENT DOCUMENTS

| JP | 2004-153277 A | 5/2004 |
| JP | 2010-157638 A | 7/2010 |

* cited by examiner

*Primary Examiner* — Thao P. Le
(74) *Attorney, Agent, or Firm* — Kenealy Vaidya LLP

(57) ABSTRACT

A semiconductor light-emitting device and a method for manufacturing the same can include a wavelength converting layer located over at least one semiconductor light-emitting chip in order to emit various colored lights including white light. The light-emitting device can include a base board, a frame located on the base board, the chip mounted on the base board, the wavelength converting layer located between an optical plate and the chip so as to extend from the optical plate toward the chip, and a reflective material layer disposed at least between the frame and both side surfaces of the wavelength converting layer and the optical plate.

20 Claims, 11 Drawing Sheets

SEMICONDUCTOR LIGHT-EMITTING
DEVICE AND MANUFACTURING METHOD

This application claims the priority benefit under 35 U.S.C. §119 of Japanese Patent Application No. 2011-028841 filed on Feb. 14, 2011, which is hereby incorporated in its entirety by reference.

BACKGROUND

1. Field

The presently disclosed subject matter relates to semiconductor light-emitting devices in which light emitted from a semiconductor light-emitting chip is wavelength-converted by a wavelength converting layer, and to manufacturing methods for the same. More particularly, the disclosed subject matter relates to semiconductor light-emitting devices for a vehicle light and the like, which can emit light having a high light-emitting density and efficiency from a small light-emitting surface, and to methods of manufacturing such devices.

2. Description of the Related Art

Semiconductor light-emitting devices, in which a part of the light emitted from a semiconductor light-emitting chip is converted into light having a different wavelength by a phosphor and in which a mixture light comprises the light having the different wavelength mixed with the light emitted directly from the light-emitting chip is emitted, have been used as a light source for various lighting units.

When the semiconductor light-emitting devices are used as a light source for a lighting unit such as a vehicle headlight, a projector, and the like, which controls light emitted from the light-emitting devices using a reflector and/or a projector lens, a light-emitting device having a small light-emitting surface may be desired to efficiently control light emitted from the light-emitting device with a small optical structure. For example, conventional semiconductor light-emitting devices, which reduce a planar light-emitting surface and a dome-shaped light-emitting surface, respectively, are disclosed in Patent Document No. 1 (Japanese Patent Application Laid Open JP2004-153277).

FIGS. 10a and 10b are side cross-sectional views showing the conventional semiconductor light-emitting devices disclosed in Patent Document No. 1. The conventional semiconductor light-emitting device 20 includes: a transparent substrate 25; a first conductive layer 26 located underneath the transparent substrate 25; a light-emitting region 28 emitting light located underneath the first conductive layer 26; a second conductive layer 32 located underneath the light-emitting region 28; a reflective contact layer 34 located underneath the second conductive layer 32; an optical cavity 35 located underneath the first conductive layer 26 and located adjacent the light-emitting region 28 and the second conductive layer 32; bumps 36 located underneath the reflective contact layer 34 and the optical cavity 35 to provide the first conductive layer 26 and the second conductive layer 32 with a driving current for the light-emitting region 28; and a ring-shaped reflective layer 22 located on a top surface of the substrate 25 so as to form a planar light-emitting surface 24 in a circular shape.

Accordingly, the semiconductor light-emitting device 20 can provide light emitted from a small light-emitting surface, which is the planar light-emitting surface 24 formed in a circular shape by covering the top surface of the substrate 25 with the ring-shaped reflective layer 22. The light-emitting device 20 also disclose a wavelength converting layer 21 located on the planar light-emitting surface 24 so as to be able to wavelength-converting light emitted from the light-emitting region 28.

However, as shown by a ray 30 in FIG. 10a, after many of the light rays emitted from the light-emitting region 28 may be reflected between the reflective layer 22 and the second reflective contact layer 34 and/or between the reflective layer 22 and the optical cavity 35 on several occasions, the light may finally be emitted from the planar light-emitting surface 24, which is formed in a small circular shape by the reflective layer 22. Therefore, a part of the light emitted from the light-emitting region 28 may decay while repeating reflections between the reflective layer 22 and at least one of the second reflective contact layer 34 and the optical cavity 35, and also may be absorbed in the light-emitting region 28, etc.

Accordingly, although the semiconductor light-emitting device 20 can emit light emitted from the small light-emitting surface 24, a light-emitting efficiency of the light may not necessarily be very high. Thus, in the conventional light-emitting device 20 it may be difficult to provide a wavelength-converted light having a high light-emitting efficiency and a high light-emitting density from the small light-emitting surface 24 via the wavelength converting layer 21.

Hence, as shown in FIG. 10b, a conventional semiconductor light-emitting device 20A is provided with a transparent dome 41, which is located wholly on the top surface of the substrate 25 so as to be able to receive almost all light emitted from the light-emitting region 28. The transparent dome 41 also includes a ring-shaped reflective layer 42 on a top surface thereof to form a small light-emitting surface, which is a dome-shaped light-emitting surface 44 formed in a circular shape in a top view from the device 20A by the reflective layer 42.

However, as shown by a ray 40 in FIG. 10b, many of the light rays emitted from the light-emitting region 28 may also be reflected between the reflective layer 42 and at least one of the second reflective contact layer 34 and the optical cavity 35 on several occasions, and the light may finally be emitted from the dome-shaped light-emitting surface 41, which is formed in a small circular shape by the reflective layer 22. Accordingly, a part of the light emitted from the light-emitting region 28 may decay while repeating reflections between the reflective layer 42 and at least one of the second reflective contact layer 34 and the optical cavity 35, and also may be absorbed in the light-emitting region 28, the transparent dome 41, etc.

In addition, a circular bottom surface of the transparent dome 41 may be difficult to completely cover the top surface of the substrate 25 formed in a square shape therewith, and therefore may be difficult to receive light emitted from a square light-emitting surface including four corners of the light-emitting region 28 at high efficiency. Thus, the conventional light-emitting device 20A may also be difficult to provide light having a high light-emitting efficiency and a high light-emitting density from the small light-emitting surface, even though the device 20A may form various small light-emitting surfaces.

Another conventional semiconductor light-emitting device having a small light-emitting surface and a high contrast between a light-emitting portion and a non-light-emitting portion may be used as a light source for a vehicle headlight, a projector and the like and is disclosed in Patent Document No. 2 (Japanese Patent Application Laid Open JP2010-157638). FIGS. 11a and 11b are a side cross-sectional view and a top view showing another conventional semiconductor light-emitting device, respectively, which is disclosed in Patent Document No. 2.

The conventional semiconductor light-emitting device 50 includes: a base board 53 having conductor patterns 54 on a mounting surface thereof; semiconductor light-emitting chips 51 mounted on the conductor patterns 54 of the base board 53, and each of chip electrodes thereof being electrically connected to a respective portion of the conductor patterns 54 via solder bumps 52; and a wavelength converting layer 55 mixing a wavelength converting material with a transparent material and disposed on a top surface of each of the light-emitting chips 51 so that an outside surface of the wavelength converting layer 55 are aligned with an outside surface of the light-emitting chips 51.

Additionally, the light-emitting device 50 includes; a first encapsulating member 56a including a light-reflecting material, the first encapsulating member 56a located around both the outside surfaces of the light-emitting chips 51 and the wavelength converting layer 55 and located between the adjacent light-emitting chips so as to encapsulate the semiconductor light-emitting chips 51 along with the mounting surface of the base board 54 and the wavelength converting layer 45; and a second encapsulating member 56b including a light-absorbing material.

The conventional semiconductor light-emitting device 50 can emit a wavelength-converted light from a small light-emitting surface via the wavelength converting layer 55, because the light-emitting surface of the conventional semiconductor light-emitting device 50 can become nearly equal to top surfaces of the light-emitting chips 51. In addition, light emitted from the both outside surfaces of the light-emitting chips 51 and the wavelength converting layer 55 may be reflected toward the wavelength converting layer 55 by the light-reflecting material included in the first encapsulating member 56a, and finally the light may be emitted from a top surface of the wavelength converting layer 55. Therefore, the conventional light-emitting device 50 may improve a light-emitting efficiency.

However, when a side surface of the first encapsulating member 56a is located perpendicular to the mounting surface of the base board 53 mounting the light-emitting chips 51 in the semiconductor light-emitting device 50 as shown in FIG. 11a, light reflected on the side surface of the first encapsulating member 56a, which contacts with the outside surface of the light-emitting chips 51, may return into the light-emitting chips 51. Accordingly, because an absorbing band of the light-emitting chips 51 may include a wavelength of the reflected light, the reflected light and an absorbing light may increase in the light-emitting chips 51.

Therefore, the increase of the reflected light and the absorbing light may cause a decrease in a total amount of light flux emitted from the conventional semiconductor light-emitting device 50. In addition, because light emitted from the top surface of each of light-emitting chips 51 may directly pass through the transparent material in the wavelength converting layer 55, the light may not enhance a light-emitting density. Thus, the conventional light-emitting device 50 may also be difficult to provide a wavelength-converted light having a high light-emitting efficiency and a high light-emitting density from the small light-emitting surface, although the device 50 may improve a contrast between the light-emitting portion and the non-light-emitting portion.

The above-referenced Patent Documents are listed below, and are hereby incorporated with their English abstracts in their entireties.
1. Patent Document No. 1: Japanese Patent Application Laid Open JP2004-153277
2. Patent Document No. 2: Japanese Patent Application Laid Open JP2010-157638

The disclosed subject matter has been devised to consider the above and other problems, features, and characteristics. Thus, embodiments of the disclosed subject matter can include semiconductor light-emitting devices that can emit a wavelength-converted light having a high light-emitting density and efficiency from a small light-emitting surface, and associated manufacturing methods that do not cause and/or are designed to prevent some of the above-described problems, concerns, and characteristics related to a wavelength converting layer. The disclosed subject matter can also include a semiconductor light-emitting device using a plurality of semiconductor light-emitting chips that can be used for wavelength-converting light having a high light-emitting density and efficiency from a small light-emitting surface.

SUMMARY

The presently disclosed subject matter has been devised in view of the above and other problems, features, and characteristics. An aspect of the disclosed subject matter includes methods of manufacture that provide semiconductor light-emitting devices having a high light-emitting density and efficiency and a small light-emitting surface and which can provide a similar lead time while using a similar manufacture machine in comparison with conventional semiconductor light-emitting devices and processes.

According to an aspect of the disclosed subject matter, a semiconductor light-emitting device can include: a base board having a conductor pattern formed on a mounting surface thereof; and a semiconductor light-emitting chip having an edge located between a top surface and a side surface, located adjacent the mounting surface of the base board, and the light-emitting chip including a substrate and at least one semiconductor layer having a light-emitting layer located between a top surface and a bottom surface of the semiconductor layer, a top surface of the substrate including the edge of the light-emitting chip, the at least one semiconductor layer located adjacent the top surface of the substrate, and including at least one chip electrode adjacent the top surface thereof, the chip electrode electrically connected to a portion of the conductor pattern of the base board via a bonding wire.

Additionally, the semiconductor light-emitting device can include: an optical plate having an edge located between a side surface and a bottom surface thereof, being located over the top surface of the at least one semiconductor layer so that a bottom surface of the optical plate overlaps the top surface of the semiconductor layer; and a wavelength converting layer having a thickness T including at least one phosphor and disposed between the edge of the optical plate and the edge of the light-emitting chip so that a side surface of the wavelength converting layer extends from the edge of the optical plate toward the edge of the light-emitting chip, while also encapsulating the at least one semiconductor layer and a part of the bonding wire; a frame located adjacent the mounting surface of the base board so as to surround the semiconductor light-emitting chip and the wavelength converting layer; and a reflective material layer disposed between the frame and three side surfaces of the semiconductor light-emitting chip, the wavelength converting layer and the optical plate while also surrounding another part of the bonding wire, wherein an inclined surface thereof contacts with the side surface of the wavelength converting layer and extends from the edge of the optical plate toward the edge of the wavelength converting layer.

In the above-described exemplary semiconductor light-emitting device, the device can further include a reflective layer located between the light-emitting layer of the at least one semiconductor layer and the top surface of the substrate to enhance a light-emitting efficiency of light emitted from the light-emitting layer toward the optical plate. The inclined surface of the reflective material layer can be formed in at least one of a substantially linear shape and a convex shape having a curvature of 1/T (T is the thickness of the wavelength converting layer) or less extending in a direction toward the frame between the edge of the semiconductor light-emitting chip and the edge of the optical plate, and also can extend from the edge of the semiconductor light-emitting chip in line with the side surface of the light-emitting chip so that at least a side surface of the semiconductor layer becomes substantially parallel with the inclined surface near the edge of the light-emitting chip in order to improve a focusing efficiency of light toward the optical plate. Additionally, the device can further include a particulate spacer disposed in the wavelength converting layer so that the thickness T can be defined between the top surface of the at least one semiconductor layer and the bottom surface of the optical plate According to the above-described exemplary semiconductor light-emitting device, the device can emit a wavelength-converted light from a top surface of the optical plate that is slightly smaller than the top surface of the semiconductor layer while the side slant of the transparent material layer can be used as a focusing reflector that extends from the edge of the optical plate toward the edge of the light-emitting chip. Furthermore, the device can also include a plurality of semiconductor light-emitting chips each having a substrate and a semiconductor layer located on the substrate with the above-described structures as set forth in the immediately preceding paragraphs. Thus, the disclosed subject matter can provide semiconductor light-emitting devices that can emit a wavelength-converted light having a high light-emitting density and efficiency from a small light-emitting surface.

Another aspect of the disclosed subject matter includes methods for manufacturing the above-described semiconductor light-emitting devices. An exemplary method can include: providing the base board; connecting the at least one chip electrode of the at least one semiconductor layer of the light-emitting chip to the portion of the conductor pattern of the base board via the bonding wire; disposing an uncured wavelength converting material between the edge of the optical plate and the edge of the light-emitting chip so that the side surface of the wavelength converting layer extends from the edge of the optical plate toward the edge of the semiconductor light-emitting chip; and disposing an uncured reflective material between the frame and the side surfaces of the semiconductor light-emitting chip, the wavelength converting layer and the optical plate.

In the above-described exemplary method for manufacturing semiconductor light-emitting devices, the same or similar variations of the device can also be employed as set forth in the paragraphs above.

According to the exemplary manufacturing method described above for the semiconductor light-emitting devices, the inclined surface of the reflective material layer used as the focusing reflector can be formed by disposing an uncured reflective material between the frame and the side surfaces of the wavelength converting layer, the light-emitting chip and the optical plate. The wavelength converting layer and the reflective material layer can be solidified by a similar method as compared to conventional processes. Thus, the method can provide semiconductor light-emitting devices having a high light-emitting density and efficiency and a small light-emitting surface using manufacturing machines that are similar to those used to manufacture conventional semiconductor light-emitting devices.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
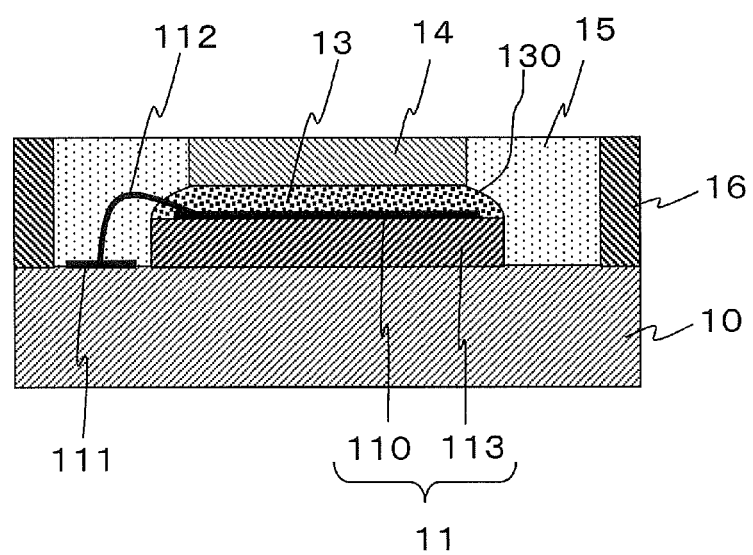
FIG. 1 is a side cross-sectional view showing a first exemplary embodiment of a semiconductor light-emitting device made in accordance with principles of the disclosed subject matter.

Exemplary embodiments and manufacturing methods of the disclosed subject matter will now be described in detail with reference to FIGS. 1 to 9b. FIG. 1 is a side cross-sectional view showing a first exemplary embodiment of a semiconductor light-emitting device made in accordance with principles of the disclosed subject matter.

The semiconductor light-emitting device can include: a base board 10 having a mounting surface and a conductor pattern (not shown in FIG. 1) formed on the mounting surface; and a semiconductor light-emitting chip 11 having an edge located between a top surface and a side surface, and having a substrate 113 and a semiconductor layer 110 including a light-emitting layer, and the semiconductor light-emitting chip 11 mounted on the mounting surface of the base board 10 via a solder, an adhesive material, etc. The semiconductor layer 110 can include a side surface, the light-emitting layer located between a top surface and a bottom surface thereof and at least one top electrode adjacent the top surface, the at least one top electrode being electrically connected to a portion 111 of the conductor pattern of the base board 10 via a bonding wire 112, the bottom surface of the semiconductor layer 110 being located adjacent a top surface of the substrate 113 that include the edge of the light-emitting chip 11.

In addition, the semiconductor light-emitting device can include: an optical plate 14 having a top surface and an edge located between a bottom surface and a side surface, being located over the top surface of the semiconductor layer 110 of the light-emitting chip 11, and the top surface and bottom surface thereof being slightly smaller than the top surface of the semiconductor layer 110 so as to overlap the top surface of the semiconductor layer 110; and a wavelength converting layer 13 having an inclined surface located between a top surface and a bottom surface, being disposed between the top surface of the substrate 113 of the light-emitting chip 11 and the bottom surface of the optical plate 14 so as to extend from the edge of the optical plate 14 toward the edge of the semiconductor light-emitting chip 11 while also encapsulating the semiconductor layer 110 including a part of the bonding wire 112 along with the top surface of the substrate 113.

Moreover, the semiconductor light-emitting device can include; a frame 16 located along an outer circumference of the base board 10 so as to surround the semiconductor light-emitting chip 11, the wavelength converting layer 13 and the optical plate 14; and a reflective material layer 15 made of a material having a high reflectivity, being disposed between the frame 16 and the side surface of the light-emitting chip 11, the inclined surface of the wavelength converting layer 13 and the side surface of the optical plate 14, and the reflective material layer 15 encapsulating the portion 111 of the conductor pattern of the base board 10 and another part of the bonding wire 112.

The base board 10 can include an Aluminum nitride substrate having a high thermal conductivity and the like, and the conductor pattern can be made from Au (gold) and the like and formed on the base board 10 to mount the semiconductor light-emitting chip 11 and to receive a power supply for the semiconductor light-emitting chip 11, in which the light-emitting layer of the semiconductor layer 110 emits light having an emission wavelength.

The semiconductor light-emitting chip 11 can be a blue LED chip having a peak wavelength of 460 nanometers. The wavelength converting layer 13 can include a phosphor to convert light emitted from the semiconductor layer 110 into a particular wavelength or range of wavelengths of light. Therefore, the phosphor can be excited by the light emitted from the semiconductor layer 110, and can emit a wavelength-converted light. Accordingly, the semiconductor light-emitting device can emit a different wavelength from that of the semiconductor layer 110 by an additive color mixture of a part of the light emitted from the semiconductor layer 110 and the wavelength-converted light excited by another part of the light.

The wavelength converting layer 13 can include a resin layer that is made by mixing a yellow phosphor with a transparent resin such as a silicone resin and the like. The yellow phosphor can emit a yellow light upon being excited by blue light emitted from the blue LED chip. The semiconductor light-emitting device can emit substantially white light by an additive color mixture of the excited yellow light emitted from the yellow phosphor and a part of the blue light emitted from the blue LED chip.

The yellow phosphor can include, $Y_3Al_5O_{12}:Ce^{3+}$ (YAG), $(Sr, Ba)_2SiO_4:Eu^{2+}$, $Ca_x(Si, Al)_{12}(O, N)_{16}:Eu^{2+}$ and the like. In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light and a part of the blue light.

The red phosphor can include $CaAlSiN_3:Eu^{2+}$, $Ca_2Si_5N_8:Eu^{2+}$, $La_2O_2S:Eu^{3+}$, $KSiF_6:Mn^{4+}$, $KTiF_6:Mn^{4+}$ and the like. $Y_3(Ga, Al)_5O_{12}:Ce^{3+}$, $Ca_3Sc_2Si_3O_{12}:Ce^{3+}$, $CaSc_2O_4:Eu^{2+}$, $(Ba, Sr)_2SiO_4:Eu^{2+}$, $Ba_3Si_6O_{12}N_2:Eu^{2+}$, $(Si, Al)_6(O, N):Eu^{2+}$ and the like can be used as the green phosphor. The semiconductor light-emitting chip 11 can include an LED of InGaN series that emits near-ultraviolet light having a wavelength of approximately 380 nanometers, a laser diode that emits ultraviolet light, and the like.

In this case, in order to emit substantially white light, the at least one phosphor can include: a red phosphor wavelength-converting the ultraviolet light into red light; a green phosphor wavelength-converting the ultraviolet light into green light; and a blue phosphor wavelength-converting the ultraviolet light into blue light. $CaAlSiN_3:Eu^{2+}$, $Ca_2Si_5N_8:Eu^{2+}$, $La_2O_2S:Eu^{3+}$, $KSiF_6:Mn^{4+}$, $KTiF_6:Mn^{4+}$ and the like can be used as the red phosphor. $(Si, Al)_6(O, N):Eu^{2+}\pm$, $BaMgAl_{10}O_{17}:Eu^{2+}Mn^{2+}$, $(Ba, Sr)_2SiO_4:Eu^{2+}$ and the like can be used as the green phosphor. $(Sr, Ca, Ba, Mg)_{10}(PO_4)_6C_{12}:Eu^{2+}$, $BaMgAl_{10}O_{17}:Eu^{2+}\pm$, $LaAl(Si, Al)_6(N, O)_{10}:Ce^{3+}$ and the like can be used as the blue phosphor.

The optical plate 14 can be formed of a transparent resin such as a silicone resin, an epoxy resin, etc. The frame 16 can be formed from the same material as the base board 10, such as with Aluminum nitride having a high thermal conductivity, ceramics, and the like. The frame 16 can be attached on the outer circumference of the mounting surface of the base board 10 via an adhesive material so as to surround the semiconductor light-emitting chip 11 and the wavelength converting layer 13 that is located between the semiconductor light-emitting chip 11 and the optical plate 14.

The reflective material layer 15 can be made by dispersing a reflective filler such as titanium oxide, zinc oxide and the like into a transparent resin such as a silicone resin and can be disposed between the frame 16 and the side surfaces of the light-emitting chip 11 and the optical plate 14 and the inclined surface of the wavelength converting layer 13 so as to encapsulate another part of the bonding wire 112 and the portion 111 of the conductor pattern of the base board 10 being connected to the bonding wire 112.

A top surface of the reflective material layer 15 can be formed between an end of the top surface of the optical plate 14 and an inner end of a top surface of the frame 16. The top surface and the bottom surface of the optical plate 14 can be slightly smaller than the top surface of the semiconductor layer 110 of the light-emitting chip 11, and the optical plate 14 can be located over the top surface of the semiconductor layer 110 so that the bottom surface of the optical plate 14 can overlap the top surface of the semiconductor layer 110, which is encapsulated by the wavelength converting layer 13 along with the substrate 113 of the light-emitting chip 11.

In other words, an outermost periphery of the semiconductor light-emitting chip 11 may be completely blocked from view by the optical plate 14 when the device is viewed from a position on the main optical axis which extends normal to the top center surface of the light-emitting chip 11. Therefore, an inclined surface 130 formed on a boundary between the reflective material layer 15 and the wavelength converting layer 13 can become a reflective surface, which can reflect light emitted in a direction toward the inclined surface 130 from the light-emitting chip 11 toward the bottom surface of the optical plate 14 while the light passes through the wavelength converting layer 13.

That is to say, the reflective material layer 15 can perform as a focusing reflector for the semiconductor layer 110 of the light-emitting chip 11, which is encapsulated in the wavelength converting layer 13 along with the top surface of the substrate 113, by using both the top surface of the substrate 113 and the inclined surface 130 of the reflective material layer 15. Thus, the semiconductor light-emitting device can improve light-emitting density and light-emitting efficiency as compared with the conventional device.

In addition, because the reflective material layer 15 contacts with the side surface of the optical plate 14, the top surface of the optical plate 14 can perform as a light-emitting surface of the semiconductor light-emitting device. Thus, the disclosed subject matter can realize a very small light-emitting surface that is slightly smaller than the top surface of semiconductor layer 110 of the light-emitting chip 11, by using the top surface of the optical plate 14.

Figure 2:
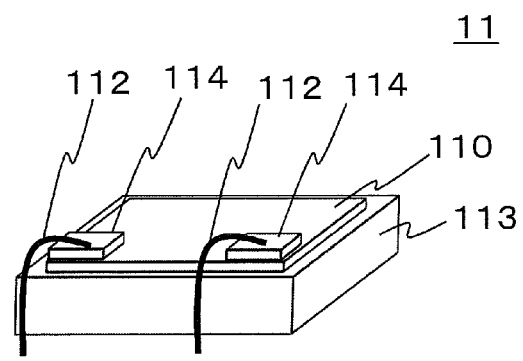
FIG. 2 is a perspective view depicting an exemplary semiconductor light-emitting chip used in the first embodiment of the semiconductor light-emitting device shown in FIG. 1.

FIG. 2 is a perspective view depicting the exemplary semiconductor light-emitting chip 11 used in the first embodiment of the semiconductor light-emitting device shown in FIG. 1. The light-emitting chip 11 can include the substrate 113, and the semiconductor layer 110 located on the substrate 113 as described above. The semiconductor layer 110 can include a plurality of epitaxially grown semiconductor layers, and also can include the light-emitting layer, which emits light having an emission wavelength by supply a driving current between a pair of top electrodes 114.

The substrate 113 of the light-emitting chip 11 can be made of an opaque material such as silicon carbide, etc. When the silicon carbide is used as the substrate 113 of the light-emitting chip 11, one of the top electrodes 114 can also be located adjacent the bottom surface of the substrate 113 as a bottom electrode because the silicon carbide substrate is an electrical conductive material. In this case, the light-emitting chip 11 can be mounted on another portion of the conductor pattern of the mounting surface of the base board 10 via the solder while the bottom surface thereof is electrically connected to the other portion of the conductor pattern.

The substrate 113 of the light-emitting chip 11 can also be made of a transparent material such as sapphire, etc. When the sapphire substrate is used as the substrate 113 of the light-emitting chip 11, the top electrodes 114 can be located adjacent the top surface of the semiconductor layer 110 because the sapphire substrate is an insulating material. In this case, the light-emitting chip 11 can be mounted on the mounting surface of the base board 10 via the adhesive material, and can include a reflective layer (not shown in FIG. 2) between the top surface of the substrate 113 and the light-emitting layer of the semiconductor layer 110 in order to efficiently direct light emitted from the light-emitting layer toward the bottom surface of the optical plate 14. The reflective layer can also be used as a reflective contact layer, which connects between a conductive layer for providing the light-emitting layer with the driving current and at least one of the top electrode 114 and the bottom electrode.

Figure 3:
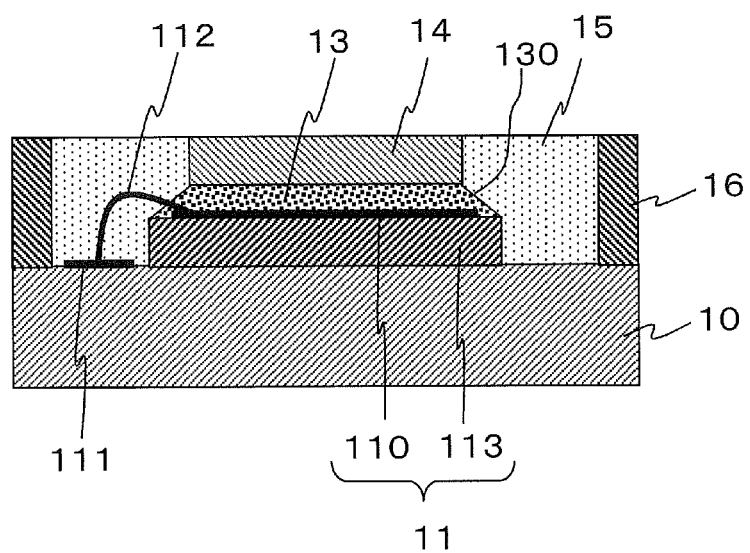
FIG. 3 is a side cross-sectional view showing an exemplary inclined surface of a reflective material layer in the first embodiment of the semiconductor light-emitting device shown in FIG. 1, wherein the inclined surface is formed in a substantially planar shape.

The inclined surface 130 of the reflective material layer 14 will now be described with reference to FIGS. 3 and 4. FIG. 3 is a side cross-sectional view showing a case where the inclined surface 130 of the reflective material layer 15 is formed in a substantially planar shape. When a thickness T of the wavelength converting layer 13 can become thick and/or a distance between a side surface of the semiconductor layer 110 and the edge of the light-emitting chip 11 can become relatively long, the inclined surface 130 of the reflective material layer 15 may be formed in a substantially planar shape because the wavelength converting layer 13 may encapsulate the semiconductor layer 110 from end to end with confidence.

Figure 4:
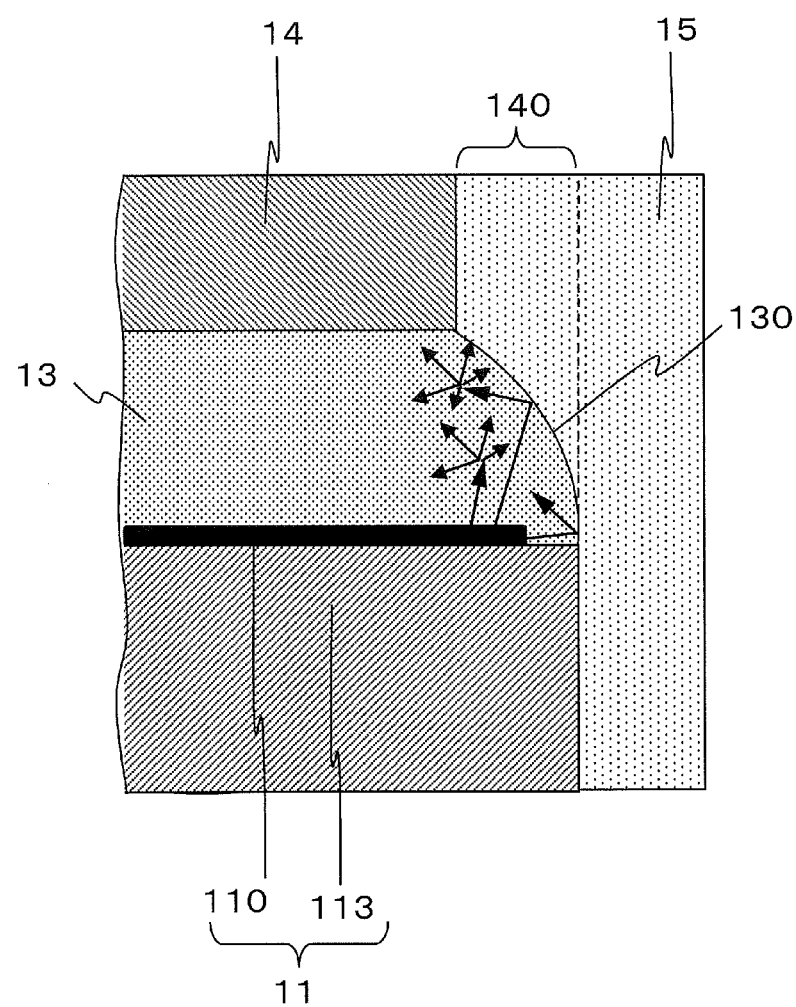
FIG. 4 is an enlarged side cross-sectional view showing an inclined surface of the reflective material layer in the first embodiment of the semiconductor light-emitting device shown in FIG. 1.

When the light-emitting device includes a thin thickness for the wavelength converting layer 13 located between the optical plate 14 and the semiconductor layer 110 and/or is to shorten the distance between the side surface of the semiconductor layer 110 and the edge of the light-emitting chip 11, the inclined surface 130 of the reflective material layer 15 can be formed in a convex shape extending in an outward direction away from the optical axis of the semiconductor light-emitting device as shown in FIG. 4.

In this case, even when the distance between the side surface of the semiconductor layer 110 and the end of the top surface of the substrate 113 that becomes the edge of the light-emitting chip 11 becomes short, the wavelength converting layer 13 can encapsulate the semiconductor layer 110 with confidence while it maintains a prescribed thickness from the side surface of the semiconductor layer 110 toward an outer region 140 thereof, which is located out of range of the bottom surface of the optical plate 14.

Thereby, light emitted from the semiconductor layer 110 can be wavelength-converted by the wavelength converting layer 13 which is located under the outer region 140 of the optical plate 14, as well as a middle region under the bottom surface of the optical plate 14. In this case, light emitted from the semiconductor layer 110 toward the inclined surface 130 can be diffused by a phosphor particle of the wavelength converting layer 13 located under the outer region 140 as shown in FIG. 4, and then may be directed toward the bottom surface of the optical plate 14.

In addition, light gotten to the inclined surface 130 in lights emitted from the side surface and the top surface of the semiconductor layer 110 can be reflected by the inclined surface 130 of the reflective material layer 14, and can be directed toward the bottom surface of the optical plate 14 while the wavelength converting layer 13 wavelength-converts a part of the light. Thus, the light-emitting device can emit a wavelength-converted light having a high light-emitting density and a high light-emitting efficiency for the top surface of the optical plate 14, which is smaller than the top surface of the light-emitting chip 11.

The inclined surface 130 of the reflective material layer 15 can extend from the end of the top surface of the substrate 113 in line with the side surface of the substrate 113 of the light-emitting chip 11 near the end of the top surface of the substrate 113 so that at least the side surface of the semiconductor layer 110 becomes substantially parallel with the inclined surface 130. The inclined surface 130 can also extend from the edge of the optical plate 14 toward the edge of light-emitting chip 11 so as to form in a convex shape extending in an outward direction away from the optical axis of the semiconductor light-emitting device as shown in FIG. 4. In this case, the inclined surface 130 of the reflective layer 15 can be formed in a curvature between zero (a linear shape) and approximately 1/T (the thickness of the wavelength converting layer 13).

If the inclined surface 130 inclines widely toward the optical axis of the device, light emitted from the light-emitting chip 11 toward the inclined surface 130 may return in a direction toward the top surface of the light-emitting chip 11. If the inclined surface 130 of the reflective material layer 15 inclines widely in an opposite direction of the optical axis of the device, the wavelength converting layer 13 may become difficult to form the thickness T in a particular thickness due to physical restriction.

A shape of the inclined surface 130 of the reflective material layer 15 can be controlled by an amount of an uncured wavelength converting material in a manufacturing process described later, in accordance with an area of the bottom surface of the optical plate 14, an area of the top surface of the light-emitting chip 11 including the semiconductor layer 110 and the thickness T of the wavelength converting layer 13.

The wavelength converting layer 13 can include a diffusing material, a bead having a predetermined particle size and the like in addition to the above-described phosphor. When the diffusing material is dispersed in the wavelength converting layer 13, a part of light emitted from the semiconductor layer 110 and the wavelength-converted light by the phosphor can be diffused by not only the phosphor but also the diffusing material. Thereby, the light-emitting device can improve a light-emitting efficiency and a variability of a light-emitting color.

Figure 5:
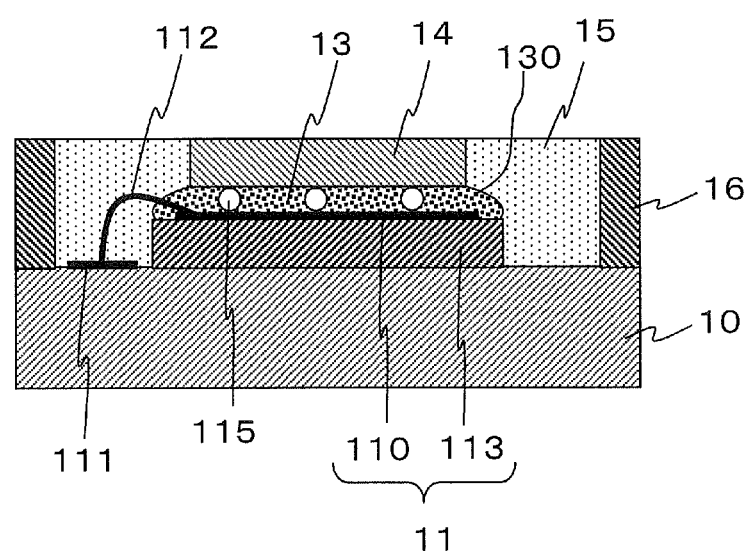
FIG. 5 is a side cross-sectional view showing an exemplary variation in the first embodiment of the semiconductor light-emitting device shown in FIG. 1, wherein a wavelength converting layer includes a spacer between a semiconductor layer and an optical plate.

FIG. 5 is a side cross-sectional view showing an exemplary variation of the wavelength converting layer 13, in which the wavelength converting layer includes a spacer between the top surface of the semiconductor layer 110 and the bottom surface of the optical plate 14. The predetermined particle size of the bead 115 can be larger than a maximum particle size of the phosphor, which is dispersed in the wavelength converting layer 13.

In this case, the bead 115 can perform as the spacer that is sandwiched between the top surface of the semiconductor layer 110 and the bottom surface of the optical plate 14. The thickness T of the wavelength converting layer 13 can be maintained by supporting the bottom surface of the transparent plate 14 using the spacer having the predetermined particle size which is located on the top surface of the semiconductor layer 110, and therefore can be defined between the top surface of the semiconductor layer 110 and the bottom surface of the optical plate 14.

The bead 115 can be formed in a circle shape having a substantially same particle size, and can be made of a transparent material such as an epoxy resin, a silicone resin, a glass bead, etc. The transparent material of the bead 115 can also include the phosphor, which is dispersed in the wavelength converting layer 13, at the same density as the wavelength converting layer 13. In addition, a spacer such that is used to maintain a space between two glass plates in a liquid crystal display such as a plastic particle can be used as the bead 115.

According to the semiconductor light-emitting device having the above-described structure, when providing the semiconductor layer 110 with the driving current via the conductor pattern of the base board 10, the semiconductor layer 110 can emit light from the top surface and the side surface thereof, and many of the light can enter into the middle region of the wavelength converting layer 13 located under the bottom surface of the optical plate 14. The wavelength converting layer 13 can include the phosphor to convert a part of the light into a particular wavelength or range of wavelengths of light and to diffuse the part of the light.

Accordingly, the semiconductor light-emitting device can emit light having a different wavelength from that of the semiconductor layer 110 by an additive color mixture of another part of the light emitted from the semiconductor layer 110 and the wavelength-converted light excited by the part of the light. Light having the different wavelength from that of the semiconductor layer 110 can move toward the bottom surface of the optical plate 14 via the wavelength converting layer 13, and then can be emitted from the top surface of the optical plate 14.

In this case, light emitted from the semiconductor layer 110 toward the inclined surface 130 of the reflective material layer 15 can also be wavelength-converted by the wavelength converting layer 13 located under the outer region 140 of the optical plate 14 as well as the middle region under the bottom surface of the optical plate 14, and can move toward the bottom surface of the optical plate 14.

Additionally, light gotten to the inclined surface 130 in the light emitted from the side surface and the top surface of the semiconductor layer 110 can be reflected by the inclined surface 130 of the reflective material layer 14, and can be directed toward the bottom surface of the optical plate 14 while the light having the different wavelength from that of the semiconductor layer 110 is wavelength-converted by the additive color mixture. Accordingly, the light-emitting device can emit a focusing wavelength-converted light from the top surface of the optical plate 14, through not only the wavelength converting layer 13 located under the bottom surface of the optical plate 14, but also the wavelength converting layer 13 located under the outer region 140 located out of range of the bottom surface of the optical plate 14.

Moreover, because the semiconductor layer 110 of the light-emitting chip 11 can be covered wholly by the wavelength converting layer 13 as compared with the conventional devices disclosed in Patent Documents No. 1 and No. 2, the light-emitting device can improve a wavelength converting efficiency and also can prevent the semiconductor layer 110 from absorbing light reflected by the reflective material layer 15. Thus, the light-emitting device can emit the wavelength-converted light having a high light-emitting density and a high light-emitting efficiency from the top surface of the optical plate 14.

Furthermore, the light-emitting device can form a small light-emitting surface, which is the top surface of the optical plate 14, and which is smaller than the top surface of the semiconductor layer 110 of the light-emitting chip 11. Accordingly, the disclosed subject matter can provide various semiconductor light-emitting devices formed in a small size, such that can be used as a light source for various lighting units with a simple structure using a small optical member such as a projector lens, a reflector, etc.

When a light-emitting density of light emitted from the top surface of the optical plate 14 of the light-emitting device is represent as a maximum increasing ratio of the light-emitting density as compared with a light-emitting density of light emitted from the top surface of the light-emitting chip 11, the maximum increasing ratio of the light-emitting density may be obtained by dividing an area of the top surface of the light-emitting chip 11 by the top surface of the optical plate 14.

Therefore, according to the semiconductor light-emitting device of the disclosed subject matter, the light-emitting density of the light can be increased by the above-described ration of the structural areas without an increase of the driving current supplied to the semiconductor layer 110. For example, when the top surface of the light-emitting chip 11 has an area of 1 mil meter square and the top surface of the optical plate 14 has an area of 0.8 mil meters, the light-emitting density of the device may increase by up to 56 percent.

In addition, the shape of the light-emitting surface cannot be limited to a rectangular shape. Various shapes such as a circle, an ellipse and the like can be formed as the light-emitting surface of the device. When the light-emitting surface is formed in a circular shape and when the device having the circular light-emitting surface is used as a light source in combination with an optical member such as a projector lens, light emitted from the light-emitting device having a high light-emitting density and efficiency and having a small circular light-emitting surface can result in lighting units having a light-emitting efficiency with a simple optical structure.

A manufacturing method for the above-described semiconductor light-emitting device will now be described in detail with reference to FIGS. 6a to 6e. FIGS. 6a to 6e are cross-sectional views showing an exemplary manufacturing process for the semiconductor light-emitting device made in accordance with principles of the disclosed subject matter.

Figure 6A:
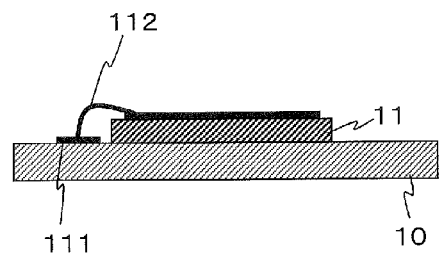
FIGS. 6a to 6e are cross-sectional views showing an exemplary manufacturing process for the semiconductor light-emitting device made in accordance with principles of the disclosed subject matter.

Process (a) is preparing the base board 10 having the conductor pattern formed on the mounting surface and the semiconductor light-emitting chip 11, mounting the semiconductor light-emitting chip 11 on the mounting surface, and electrically connecting the at least one top electrode to the portion 111 of the conductor pattern of the base board 10 via the bonding wire 112, as shown in FIG. 6a.

Figure 6B:
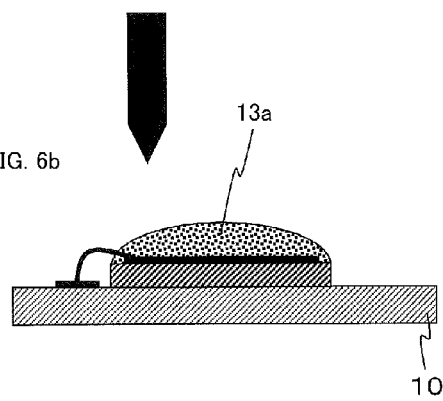

Process (b) is applying an uncured wavelength converting material 13a that is made by mixing the phosphor with the transparent resin such as a silicon resin on the top surface of the semiconductor light-emitting chip 11, as shown in FIG. 6b.

Figure 6C:
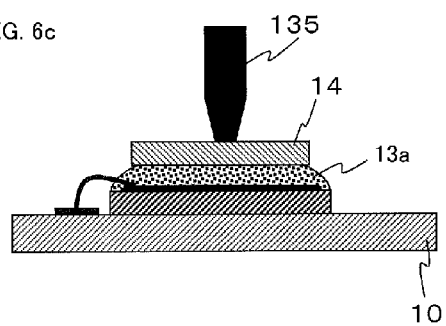
Figure 6D:
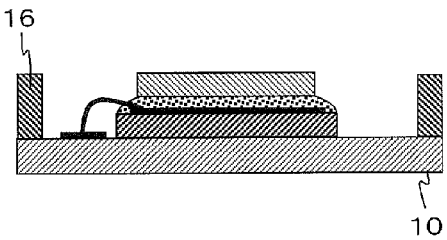
Figure 6E:
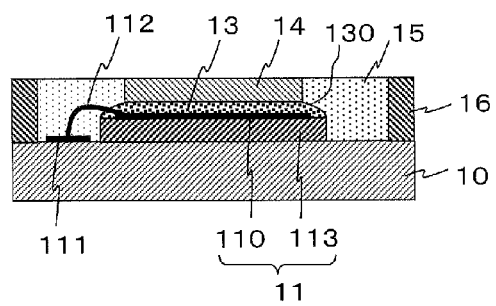

Process (c) is mounting the optical plate 14 that is formed in a plate shape and is formed in a slightly smaller size than the top surface of the semiconductor layer 110 of the light-emitting chip 11 on the wavelength converting material 13a by a mounting device 135 and the like, forming the focusing reflector shape of the uncured wavelength converting material 13a that extends from the bottom surface of the optical plate 14 toward the end of the top surface of the substrate 113 of the light-emitting chip 11 by maintaining a surface tension while the uncured wavelength converting material 13a covers at least the semiconductor layer 110 of the light-emitting chip 11, and solidifying the uncured wavelength converting material 13a under a prescribed curing condition, as shown in FIG. 6c. In this case, the uncured wavelength converting material 13a may be semi-solidified under a semi-curing condition if the reflector shape does not vary in following processes.

In the above-described process (c), when an amount of the uncured wavelength converting material 13a is relatively small, the inclined surface 130 may be formed in a substantially linear shape as shown in FIG. 3. When the amount of the uncured wavelength converting material 13a increases, the inclined surface 130 may be formed in a convex surface extending in the outward direction away from the optical axis of the light-emitting device as shown in FIGS. 1 and 4.

Process (d) is attaching the frame 16 on the outer circumference of the mounting surface of the base board 10 via the adhesive material so as to surround the semiconductor light-emitting chip 11 and the wavelength converting layer 13, which is located between the semiconductor light-emitting chip 11 and the optical plate 14.

Process (e) is disposing an uncured reflective material between the frame 16 and the inclined surface of the wavelength converting layer 13 and both side surfaces of the optical plate 14 and the substrate 113 of the light-emitting chip 11 so that the uncured reflective material can contact with the both side surfaces of the optical plate 14 and the substrate 113 and the inclined surface of the wavelength converting layer 13 without a space, by a dispenser and the like, thus forming the reflective material layer 15 including the above-described inclined surface 130 by solidifying the uncured reflective material under a prescribed curing condition, and finishing the semiconductor light-emitting device. The above process steps can be done consecutively and sequentially, or can be interchanged in timing and non-sequential.

According to the manufacturing method of the disclosed subject matter, by creating the inclined surface 130 of the wavelength converting layer 13 using the surface tension of the uncured wavelength converting material 13a, and by disposing the uncured reflective material between the frame 16 and the both side surfaces of the optical plate 14 and the substrate 113 and the inclined surface of the wavelength converting layer 13, the inclined surface 130 of the reflective material layer 15 can be formed in a prescribed shape.

Therefore, even when the top and bottom surface of the optical plate 14 is formed in various shapes such as the circular shape in addition to the rectangular shape, the inclined surface 130 of the reflective material layer 15 can be formed in the prescribed shape. Accordingly, light emitted from the semiconductor layer 110 can enter into the wavelength converting layer 13 and most of the light can gather toward the bottom surface of the optical plate 14.

Thereby, the focusing reflector shape having a predetermined shape can be formed from the top surface of the semiconductor light-emitting chip 11 to the bottom surface of the optical plate 14 without a machining process. Accordingly, the manufacturing method can prevent the semiconductor light-emitting chip 11 from absorbing light returned on the side surface of the light-emitting chip 11. Thus, the manufacturing method can provide semiconductor light-emitting devices having a high light-emitting density and efficiency and having a small light-emitting surface, which can be formed in various small shapes such that light emitted from the device can be efficiently controlled by a small and simple optical member.

In addition, the device can be provided with a rough surface on at least one of the top surface and the bottom surface of the optical plate 14 in order to reduce a color variation of light emitted from the top surface of the optical plate 14. The device can further improve the color variation of the light by enhancing a light scattering effect using the rough surface, which is formed on at least one of the top surface and the bottom surface of the optical plate 14.

Moreover, in the above-described manufacturing method, the optical plate 14 can be arranged in the center of the light-emitting chip 11 by a self-alignment effect using the surface tension of the uncured wavelength converting layer 13a. The ratio of the area of the top surface of the light-emitting chip 11 to the area of the bottom surface of the optical plate 14 can be between 1.5 and 4.0 in order to efficiently leverage the self-alignment effect of the optical plate 14. However, the disclosed subject matter cannot be limited to the ratio between 1.5 and 4.0, because the optical plate 14 can be arranged in the center of the light-emitting chip 11 by using a mounting device.

Figure 7A:
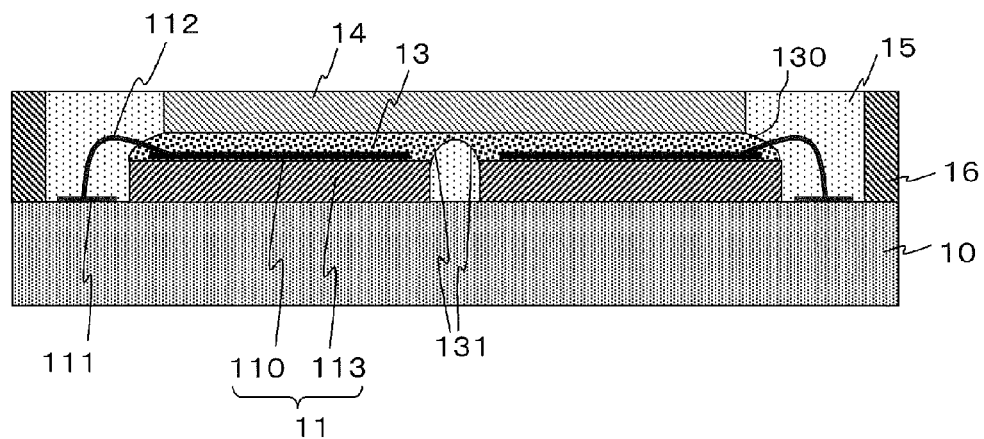
FIGS. 7a and 7b are a side cross-sectional view and a top view showing a second exemplary embodiment of a semiconductor light-emitting device made in accordance with principles of the disclosed subject matter, respectively.
Figure 7B:
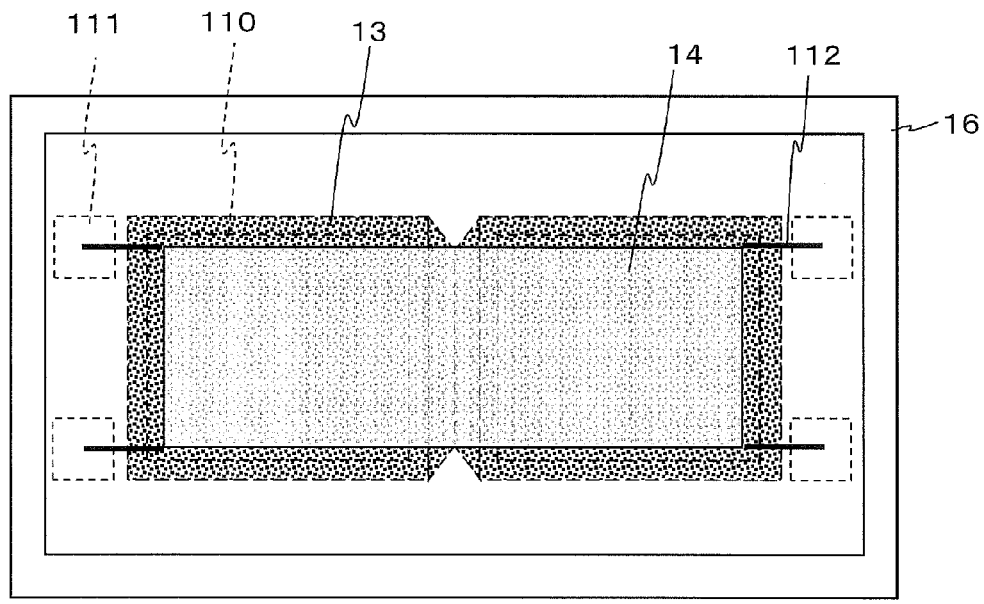

Second exemplary embodiments will now be described with reference to FIGS. 7a and 7b. FIGS. 7a to 7b are a side cross-sectional view and a top view showing the second exemplary embodiments including a plurality of light-emitting chips of a semiconductor light-emitting device made in accordance with principles of the disclosed subject matter.

The semiconductor light-emitting device can include: a base board 10 having a mounting surface and a conductor pattern formed on the mounting surface; and a plurality of semiconductor light-emitting chips 11 having an edge between a top surface and a side surface, each of the light-emitting chips 11 having a substrate 113 and a semiconductor layer 110 including a light-emitting layer, each of the substrates 113 having a bottom surface and a top surface including the edge of the light-emitting chips 11, each of the semiconductor layers 110 having a top surface, a bottom surface and at least one top electrode adjacent the top surface of each of the semiconductor layers 110, the at least one top electrode of each of the semiconductor layers 110 being electrically connected to a respective portion 111 of the conductor pattern of the base board 10 via a respective one of bonding wires 112, the bottom surface of each of the semiconductor layers 110 being located adjacent the top surface of each of the substrates 113, and the semiconductor light-emitting chips 11 having at least one pair of adjacent surfaces between the adjacent light-emitting chips, and mounted on the mounting surface of the base board 10 so that the bottom surface of each of the substrates 113 is located adjacent the mounting surface.

The semiconductor light-emitting chips 11 can be aligned so that each of the at least one pair of adjacent surfaces of the light-emitting chips 11 is substantially parallel with respect to each other. Additionally, the semiconductor light-emitting device can include an optical plate 14 having a top surface, a bottom surface, a side surface and an edge located between the side surface and the bottom surface of the optical plate 14. The optical plate 14 can be located over the top surface of the semiconductor light-emitting chips 11, and each of the top surface and the bottom surface of optical plate 14 can be slightly smaller than the top surface of the light-emitting chips 11.

The semiconductor light-emitting device can also include a wavelength converting layer 13 having an inclined surface 130 and at least one concave surface 131, which is located from an edge of each of the at least one pair of adjacent surfaces of the light-emitting chips 11 toward the optical plate 14. The wavelength converting layer 13 can be disposed between the edge of the semiconductor light-emitting chips 11 and the edge of the optical plate 14.

Accordingly, the inclined surface 130 of the wavelength converting layer 13 can extend from the edge of the optical plate 14 toward the edge of the semiconductor light-emitting chips 11. The at least one concave surface 131 of the wavelength converting layer 13 can be formed in a concave shape from the edge of each of the at least one pair of adjacent surfaces of the light-emitting chips 11 toward the bottom surface of the optical plate 14.

Moreover, the semiconductor light-emitting device can include a frame 16 located along an outer circumference of the base board 10 so as to surround the light-emitting chips 11 and the wavelength converting layer 13. A reflective material layer 15 can be disposed between the frame 16 and the side surface of the optical plate 14, the inclined surface 130 of the wavelength converting layer 13 and the side surface of the light-emitting chips 11, and also can be disposed under the at least one concave surface 131 of the wavelength converting layer 13 so as to fill a space between the at least one pair of adjacent surfaces of the light-emitting chips 11.

The inclined surface 130 of the reflective material layer 15 can extend from the end of the top surface of the substrate 113 in line with the side surface of the light-emitting chips 11 near the end of the top surface of each of the substrates 113 so that at least the side surface of each of the semiconductor layers 110 becomes substantially parallel with the inclined surface 130. The inclined surface 130 can also extend from the edge of the optical plate 14 toward the edge of the light-emitting chips 11 so as to form in a convex shape extending in an outward direction away from the optical axis of the semiconductor light-emitting device in common with the first embodiment, as shown in FIG. 7a. In this case, the inclined surface 130 of the reflective layer 15 can also be formed in a curvature between zero and approximately 1/T (the thickness of the wavelength converting layer 13).

According to the second embodiment of the semiconductor light-emitting device having the above-described structure, each of the semiconductor layers 110 can emit light from the top surface and the side surface thereof, and the light can enter into the wavelength converting layer 13, which can also performs as a focusing reflector for the semiconductor layers 110. Accordingly, the light-emitting device of the second embodiment can also emit the wavelength-converted light having a high light-emitting density and a high light-emitting efficiency from the top surface of the optical plate 14, because the inclined surface 130 and the at least one convex surface 131 of the reflective material layer 15 can be formed so as to gather the wavelength-converted light from the top surface of the light-emitting chips 11 toward the optical plate 14. The second embodiment can provide light having a higher light-intensity from a slightly larger light-emitting surface as compared with the first embodiment, and therefore can be used as a light source for a vehicle headlight, etc.

A manufacturing method for the second embodiment of the semiconductor light-emitting device can be basically the same as that for the first embodiment shown in FIGS. 6a to 6e. In the structure shown in FIGS. 7a and 7b, the uncured wavelength converting material 13a can be equally applied on the top surface of each of the light-emitting chips 11, and the optical plate 14 can be mounted on the uncured wavelength converting material 13a covering the top surface of each of the light-emitting chips 11. The wavelength converting layer 13 can be formed between the edge of the optical plate 14 and the edge of the light-emitting chips 11 so that the inclined surface 130 can be formed in a prescribed shape and the at least one concave surface 131 can be formed from the edge of each of the at least one pair of adjacent surfaces toward the optical plate 14.

However, when the wavelength converting layer 13 connects each space above or on light-emitting chips 11 to the space between the adjacent light-emitting chips as shown in FIGS. 7a and 7b, an amount of the uncured wavelength converting material 13a applied on the top surface of each of the light-emitting chips 11 can vary so that a total amount of the uncured wavelength converting material 13a becomes a predetermined amount.

More specifically, in the structure of the wavelength converting layer 13 shown in FIGS. 7a and 7b, when the wavelength converting layer 13 is formed between the edges of the optical plate 14 and the light-emitting chips 11 using the uncured wavelength converting material 13a, the uncured wavelength converting material 13a can be disposed between the bottom surface of the optical plate 14 and the top surface of each of the light-emitting chips 11 so that the uncured wavelength converting material 13a can form in a cavity shape from the at least one pair of adjacent surfaces of the light-emitting chips 11 toward the bottom surface of the optical plate 14.

Figure 8:
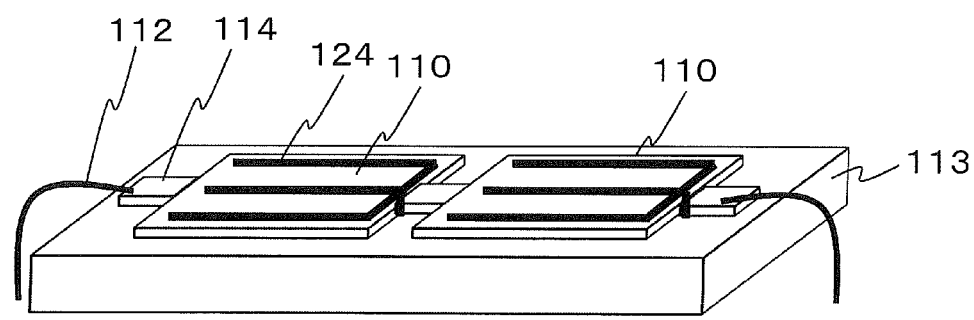
FIG. 8 is a perspective view depicting an exemplary semiconductor light-emitting chip used in a third embodiment of a semiconductor light-emitting device made in accordance with principles of the disclosed subject matter.

Third exemplary embodiments will now be described with reference to FIGS. 8 to 9b. FIG. 8 is a perspective view depicting an exemplary semiconductor light-emitting chip used in the third embodiment. The semiconductor light-emitting device of the third embodiment can include an edge located between a top surface and a side surface thereof, a substrate 113 having a top surface and a plurality of semiconductor layers 110 each having a top surface, a side surface, a bottom surface and a light-emitting layer located between the top surface and the bottom surface.

The top surface of the substrate 113 can include the edge of the semiconductor light-emitting chip, and the semiconductor layer 110 can be located adjacent the top surface of the substrate 113 so that the bottom surface of each of the semiconductor layers 110 faces the top surface of the substrate 113. Each of the semiconductor layers 110 can include at least one top electrode 124 adjacent the top surface of each of the semiconductor layers 110, and the at least one top electrode electrically connected to a chip electrode 114.

The plurality of semiconductor layers 110 can be aligned adjacent the top surface of the substrate 113 so that at least one pair of adjacent side surfaces is substantially parallel with respect to each other as shown in FIG. 8. The plurality of semiconductor layers 110 can also be arranged adjacent the top surface of the substrate 113 in matrix so that a plurality of pairs of adjacent side surfaces are substantially parallel with respect to each other.

Each of the semiconductor layers 110 can include a bottom electrode adjacent the bottom surface of each of the semiconductor layers 110, and the bottom electrode of each of the semiconductor layers 110 can be electrically connected to each other as a common electrode of the semiconductor light-emitting chip. The bottom electrode of each of the semiconductor layers 110 can disconnect with respect to each other, and therefore can also be used as an independent electrode with respect to each other.

Figure 9A:
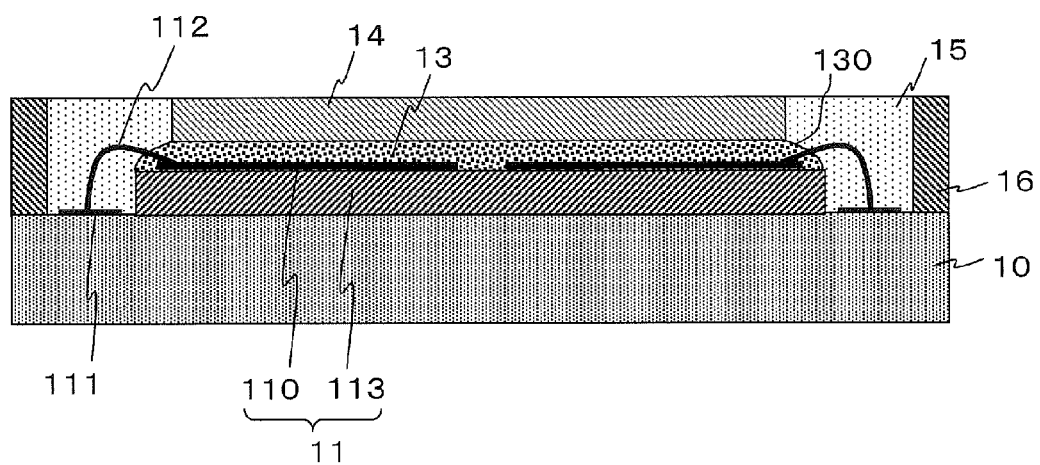
FIGS. 9a and 9b are a side cross-sectional view and a top view showing the third embodiment of a semiconductor light-emitting device made in accordance with principles of the disclosed subject matter, respectively.
Figure 9B:
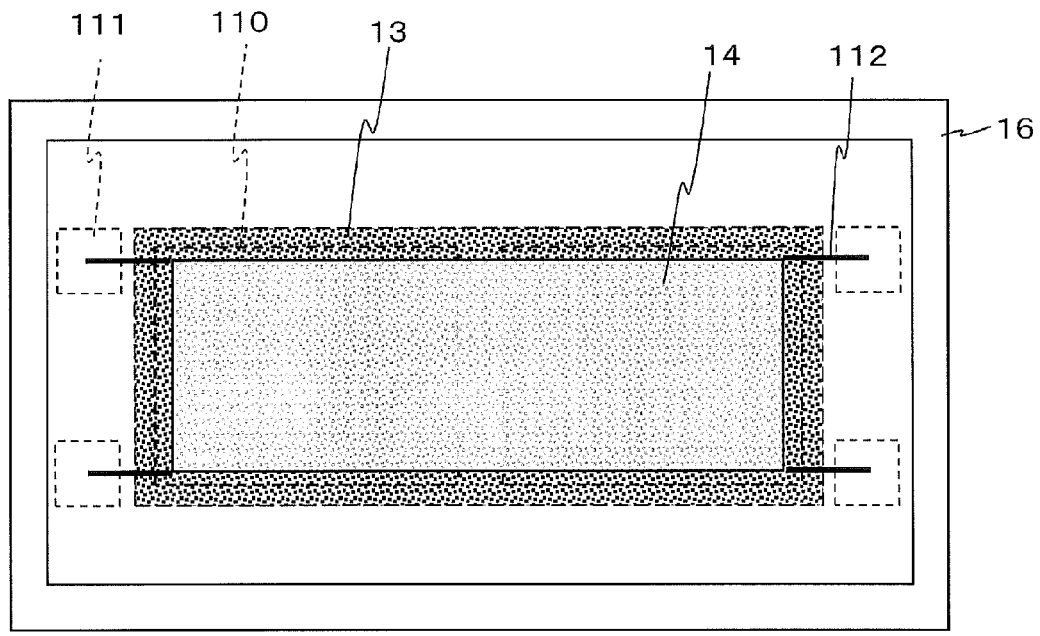
Figure 10A:
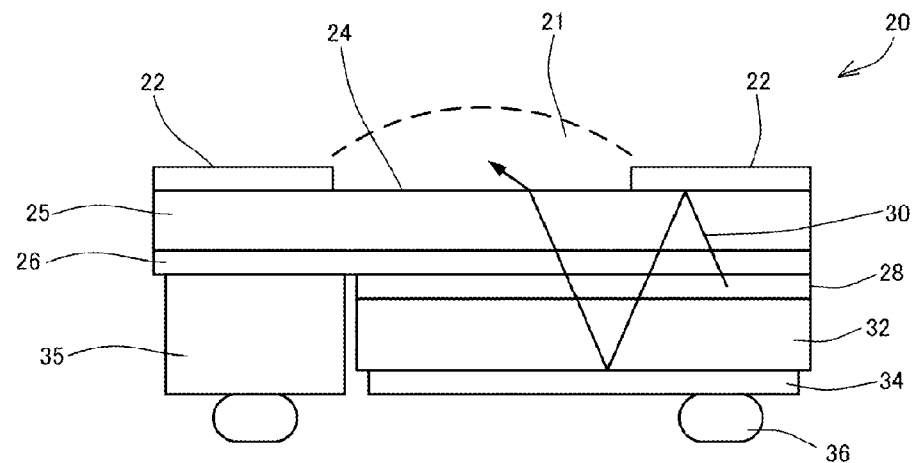
FIGS. 10a and 10b are side cross-sectional views showing conventional semiconductor light-emitting devices, which reduce a planar light-emitting surface and a dome-shaped light-emitting surface, respectively.
Figure 10B:
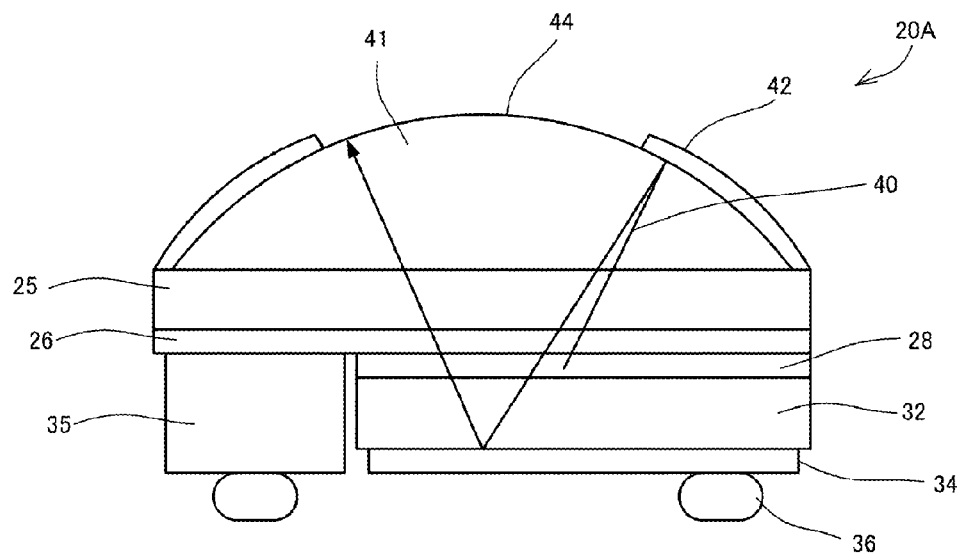
Figure 11A:
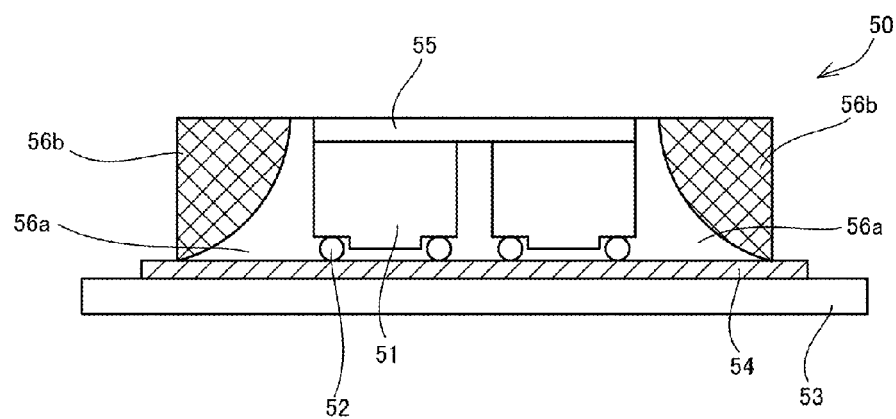
FIGS. 11a and 11b are a side cross-sectional view and a top view showing another conventional semiconductor light-emitting device, respectively.
Figure 11B:
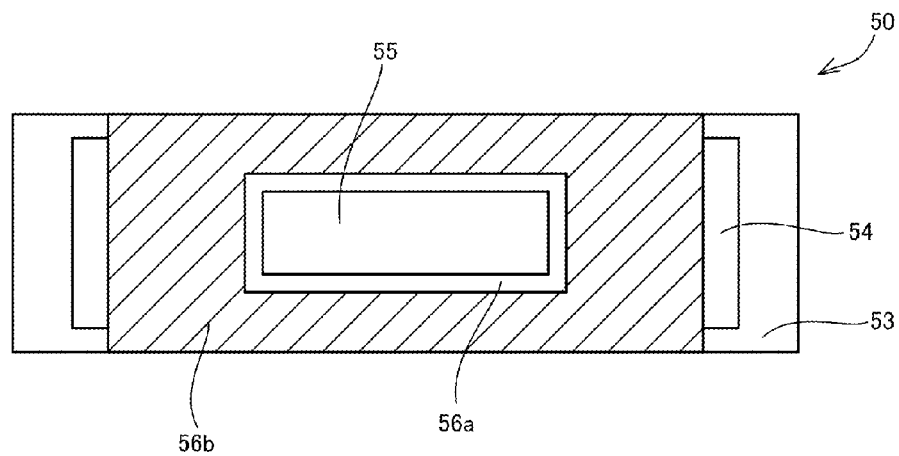

FIGS. 9a and 9b are a side cross-sectional view and a top view showing the third embodiment of the semiconductor light-emitting device made in accordance with principles of the disclosed subject matter, respectively. The light-emitting device can include an optical plate 14 having an edge located between a side surface and a bottom surface thereof, being located over the top surface of each of the semiconductor layers 110 so that the bottom surface thereof can overlap the top surface of each of the semiconductor layers 110.

In addition, the light-emitting device can include a wavelength converting layer 13 disposed between the edge of the optical plate 14 and the edge of the semiconductor light-emitting chips so that a inclined surface 130 thereof extends from the edge of the optical plate 14 toward the edge of the semiconductor light-emitting chips 11, while also encapsulating the semiconductor layers 110 and parts of bonding wires 112.

Moreover, the device can include a frame 16 and a reflective material layer 15 in common with the structure of the thirst embodiment. Accordingly, because the inclined surface 130 of the reflective material layer 15 can be formed as a focusing reflector for the plurality of semiconductor layers 110 from the edge of the light-emitting chips 11 toward the edge of the optical plate 14, the light-emitting device of the third embodiment can also emit the wavelength-converted light having a high light-emitting density and a high light-emitting efficiency from the top surface of the optical plate 14.

Furthermore, the third embodiment can provide light having a higher light-intensity from a slightly larger light-emitting surface as compared with the first embodiment, and therefore can be used as a light source for a vehicle headlight, etc. In this case, the light-emitting device can emit the wavelength-converted light from the plurality of semiconductor layers 110 located on the top surface of the substrate 113, and therefore can result in a reduce of the manufacturing process and a high positional accuracy of the light-emitting surface.

A manufacturing method for the third embodiment of the semiconductor light-emitting device can be basically the same as that for the first embodiment shown in FIGS. 6a to 6e, except the plurality of semiconductor layers 110 in place of the single semiconductor layer 110. Accordingly, descriptions of the manufacturing method would be abbreviated.

As described above, the disclosed subject matter can form a light-emitting surface in a small shape such that is slightly smaller than at least one semiconductor layer of at least one semiconductor light-emitting chip 11, and can improve a light-emitting density and efficiency by using the inclined surface 130 of the reflective material layer 15 as a focusing reflector for the light-emitting chip 11. Thus, the disclosed subject matter can provide a semiconductor light-emitting device having a small light-emitting surface and a high light-emitting density and efficiency, which can be used for lighting units such as a vehicle headlight that controls light emitted from the light-emitting device using a reflector and/or a projector lens.

Moreover, the inclined surface 130 can be formed by disposing the uncured wavelength converting material 13a on the top surface of the at least one semiconductor layer 110 and by disposing the uncured reflective material between the frame 16 and at least the wavelength converting layer 13 without a mechanical process. Thus, the method of the disclosed subject matter can provide a semiconductor light-emitting device capable of being used as a lighting unit such as a headlight using manufacturing machines that are similar to those used to manufacture conventional semiconductor light-emitting devices.

Furthermore, the above-described embodiments are mainly described as a light source device for a vehicle headlight. However, the semiconductor light-emitting device can incorporate various colored lights by combining the above-described semiconductor chip 11 with the wavelength converting layer 13 including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, the multiple chip embodiment could include slant surfaces 130 that are convex. In addition, it is contemplated that any different color chip or different wavelength material can be used in any of the disclosed embodiments and in any combination.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light-emitting device comprising:
   a base board having a mounting surface and a conductor pattern located adjacent the mounting surface;
   a semiconductor light-emitting chip having a top surface, a side surface, a bottom surface and an edge located between the top surface and the side surface, located adjacent the mounting surface of the base board so that the bottom surface faces the mounting surface, and the semiconductor light-emitting chip includes a substrate having a top surface and at least one semiconductor layer having a top surface, a side surface, a bottom surface and a light-emitting layer located between the top surface and the bottom surface of the semiconductor layer, the top surface of the substrate including the edge of the semiconductor light-emitting chip, the at least one semiconductor layer located adjacent the top surface of the substrate so that the bottom surface of the semiconductor layer faces the top surface of the substrate, and including at least one chip electrode adjacent the top surface of the at least one semiconductor layer, the at least one chip electrode electrically connected to a portion of the conductor pattern of the base board via a bonding wire;

an optical plate having a side surface, a bottom surface and an edge located between the side surface and the bottom surface, the optical plate being located over the top surface of the at least one semiconductor layer of the semiconductor light-emitting chip so that the bottom surface of the optical plate overlaps the top surface of the at least one semiconductor layer;

a wavelength converting layer having a side surface and a thickness, the wavelength converting layer disposed between the edge of the optical plate and the edge of the semiconductor light-emitting chip so that the side surface of the wavelength converting layer extends from the edge of the optical plate toward the edge of the semiconductor light-emitting chip, and the wavelength converting layer encapsulating the at least one semiconductor layer and a part of the bonding wire;

a frame located adjacent the mounting surface of the base board so as to surround the semiconductor light-emitting chip and the wavelength converting layer; and a reflective material layer having an inclined surface disposed between the frame and the side surface of the semiconductor light-emitting chip, the side surface of the wavelength converting layer and the side surface of the optical plate while also surrounding another part of the bonding wire, wherein the inclined surface contacts with the side surface of the wavelength converting layer and extends from the edge of the optical plate toward the edge of the wavelength converting layer.

2. The semiconductor light-emitting device according to claim 1, further comprising:
a reflective layer located between the light-emitting layer of the at least one semiconductor layer and the top surface of the substrate.

3. The semiconductor light-emitting device according to claim 1, wherein the inclined surface of the reflective material layer is formed in at least one of a substantially linear shape and a convex shape having a curvature of an inverse of the thickness of the wavelength converting layer or less extending in a direction toward the frame between the edge of the semiconductor light-emitting chip and the edge of the optical plate.

4. The semiconductor light-emitting device according to claim 2, wherein the inclined surface of the reflective material layer is formed in at least one of a substantially linear shape and a convex shape having a curvature of an inverse of the thickness of the wavelength converting layer or less extending in a direction toward the frame between the edge of the semiconductor light-emitting chip and the edge of the optical plate.

5. The semiconductor light-emitting device according to claim 1, wherein the inclined surface of the reflective material layer extends from the edge of the semiconductor light-emitting chip in line with the side surface of the semiconductor light-emitting chip so that at least the side surface of the semiconductor layer becomes substantially parallel with the inclined surface near the edge of the semiconductor light-emitting chip.

6. The semiconductor light-emitting device according to claim 2, wherein the inclined surface of the reflective material layer extends from the edge of the semiconductor light-emitting chip in line with the side surface of the semiconductor light-emitting chip so that at least the side surface of the semiconductor layer becomes substantially parallel with the inclined surface near the edge of the semiconductor light-emitting chip.

7. The semiconductor light-emitting device according to claim 1, further comprising:
a particulate spacer disposed in the wavelength converting layer, wherein the thickness of the wavelength converting layer is defined between the top surface of the at least one semiconductor layer of the semiconductor light-emitting chip and the bottom surface of the optical plate by supporting the bottom surface of the optical plate using the particulate spacer located on the top surface of the at least one semiconductor layer.

8. The semiconductor light-emitting device according to claim 2, further comprising:
a particulate spacer disposed in the wavelength converting layer, wherein the thickness of the wavelength converting layer is defined between the top surface of the at least one semiconductor layer of the semiconductor light-emitting chip and the bottom surface of the optical plate by supporting the bottom surface of the optical plate using the particulate spacer located on the top surface of the at least one semiconductor layer.

9. A semiconductor light-emitting device comprising:
a base board having a mounting surface and a conductor pattern located adjacent the mounting surface;

a plurality of semiconductor light-emitting chips having a top surface, a side surface, an edge located between the top surface and the side surface and at least one pair of adjacent surfaces each having an edge, and each of the semiconductor light-emitting chips including a substrate having a top surface and a semiconductor layer having a top surface, a side surface, a bottom surface and a light-emitting layer located between the top surface and the bottom surface of the semiconductor layer, being formed in a substantially cubic shape, the top surface of the substrate of each of the semiconductor light-emitting chips including the edge of the semiconductor light-emitting chips and edge of each of the at least one pair of adjacent surfaces, the top surface of the semiconductor layer of each of the semiconductor light-emitting chips including at least one chip electrode adjacent the top surface of the semiconductor layer of each of the semiconductor light-emitting chips, the at least one chip electrode of each of the semiconductor light-emitting chips electrically connected to a respective portion of the conductor pattern of the base board via a respective one of bonding wires, and the plurality of semiconductor light-emitting chips aligned adjacent the mounting surface of the base board so that each of the at least one pair of adjacent surfaces is substantially parallel with respect to each other;

an optical plate having a side surface, a bottom surface and an edge located between the side surface and the bottom surface of the optical plate, the optical plate being located over the top surface of the semiconductor layer of each of the semiconductor light-emitting chips so that the bottom surface of the optical plate overlaps the top surface of the semiconductor layer of each of the semiconductor light-emitting chips;

a wavelength converting layer having a side surface, a thickness and at least one concave surface, the wavelength converting layer disposed between the edge of the optical plate and the edge of the semiconductor light-emitting chips so that the side surface of the wavelength converting layer extends from the edge of the optical plate toward the edge of the semiconductor light-emitting chips, the at least one concave surface of the wavelength converting layer being formed in a concave shape from the edge of each of the at least one pair of adjacent surfaces of the semiconductor light-emitting chips toward the optical plate, and the wavelength converting layer encapsulating the semiconductor layer of each of the semiconductor light-emitting chips and a part of the respective one of the bonding wires;

a frame located adjacent the mounting surface of the base board so as to surround the semiconductor light-emitting chips and the wavelength converting layer; and a reflective material layer having an inclined surface and at least one convex surface disposed between the frame and the side surface of the semiconductor light-emitting chips, the side surface of the wavelength converting layer and the side surface of the optical plate and between the at least one concave surface of the wavelength converting layer and the mounting surface of the base board while also surrounding another part of the respective one of the bonding wires, wherein the inclined surface contacts with the side surface of the wavelength converting layer and extends from the edge of the optical plate toward the edge of the wavelength converting layer, and the at least one convex surface also contacts with the at least one concave surface of the wavelength converting layer and extends between the at least one pair of adjacent surfaces of the plurality of semiconductor light-emitting chips and underneath the at least one concave surface of the wavelength converting layer.

10. The semiconductor light-emitting device according to claim 9, further comprising:
a reflective layer located between the light-emitting layer of the semiconductor layer of each of the semiconductor light-emitting chips and the top surface of the substrate of each of the semiconductor light-emitting chips.

11. The semiconductor light-emitting device according to claim 9, wherein the inclined surface of the reflective material layer is formed in at least one of a substantially linear shape and a convex shape having a curvature of an inverse of the thickness of the wavelength converting layer or less extending in a direction toward the frame between the edge of the semiconductor light-emitting chips and the edge of the optical plate.

12. The semiconductor light-emitting device according to claim 10, wherein the inclined surface of the reflective material layer is formed in at least one of a substantially linear shape and a convex shape having a curvature of an inverse of the thickness of the wavelength converting layer or less extending in a direction toward the frame between the edge of the semiconductor light-emitting chips and the edge of the optical plate.

13. The semiconductor light-emitting device according to claim 9, wherein the inclined surface of the reflective material layer extends from the edge of the semiconductor light-emitting chips in line with the side surface of the semiconductor light-emitting chips so that at least the side surface of the semiconductor layer of each of the semiconductor light-emitting chips becomes substantially parallel with the inclined surface near the edge of the semiconductor light-emitting chips that is located adjacent the side surface of the semiconductor layer of each of the semiconductor light-emitting chips.

14. The semiconductor light-emitting device according to claim 10, wherein the inclined surface of the reflective material layer extends from the edge of the semiconductor light-emitting chips in line with the side surface of the semiconductor light-emitting chips so that at least the side surface of the semiconductor layer of each of the semiconductor light-emitting chips becomes substantially parallel with the inclined surface near the edge of the semiconductor light-emitting chips that is located adjacent the side surface of the semiconductor layer of each of the semiconductor light-emitting chips.

15. The semiconductor light-emitting device according to claim 9, further comprising:
a particulate spacer disposed in the wavelength converting layer, wherein the thickness of the wavelength converting layer is defined between the top surface of the semiconductor layer of each of the semiconductor light-emitting chips and the bottom surface of the optical plate by supporting the bottom surface of the optical plate using the particulate spacer located on the top surface of the semiconductor layer of each of the semiconductor light-emitting chips.

16. The semiconductor light-emitting device according to claim 10, further comprising:
a particulate spacer disposed in the wavelength converting layer, wherein the thickness of the wavelength converting layer is defined between the top surface of the semiconductor layer of each of the semiconductor light-emitting chips and the bottom surface of the optical plate by supporting the bottom surface of the optical plate using the particulate spacer located on the top surface of the semiconductor layer of each of the semiconductor light-emitting chips.

17. A method for manufacturing the semiconductor light-emitting device according to claim 1, comprising:
providing the base board;
connecting the at least one chip electrode of the at least one semiconductor layer of the semiconductor light-emitting chip to the portion of the conductor pattern of the base board via the bonding wire;
disposing an uncured wavelength converting material between the edge of the optical plate and the edge of the semiconductor light-emitting chip so that the side surface of the wavelength converting layer extends from the edge of the optical plate toward the edge of the semiconductor light-emitting chip; and
disposing an uncured reflective material between the frame and the side surface of the semiconductor light-emitting chip, the side surface of the wavelength converting layer and the side surface of the optical plate.

18. The method for manufacturing the semiconductor light-emitting device according to claim 17, wherein the inclined surface of the reflective material layer is formed in at least one of a substantially linear shape and a convex shape having a curvature of an inverse of the thickness of the wavelength converting layer or less extending in a direction toward the frame between the edge of the semiconductor light-emitting chip and the edge of the optical plate.

19. A method for manufacturing the semiconductor light-emitting device according to 9, comprising:
providing the base board;
connecting the at least one chip electrode of each of the semiconductor light-emitting chips to the respective portion of the conductor pattern of the base board via the respective one of the bonding wires;

disposing an uncured wavelength converting material between the edge of the optical plate and the edge of the semiconductor light-emitting chips so that the side surface of the wavelength converting layer extends from the edge of the optical plate toward the edge of the semiconductor light-emitting chips; and disposing an uncured reflective material between the frame and the side surface of the semiconductor light-emitting chips, the side surface of the wavelength converting layer and the side surface of the optical plate.

20. The method for manufacturing the semiconductor light-emitting device according to 19, wherein the inclined surface of the reflective material layer is formed in at least one of a substantially linear shape and a convex shape having a curvature of an inverse of the thickness of the wavelength converting layer or less extending in a direction toward the frame between the edge of the semiconductor light-emitting chips and the edge of the optical plate.

* * * * *